United States Patent
Miyake

(10) Patent No.: US 7,084,922 B2
(45) Date of Patent: Aug. 1, 2006

(54) PICKUP DEVICE

(75) Inventor: Hiroyuki Miyake, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 593 days.

(21) Appl. No.: 09/789,583

(22) Filed: Feb. 22, 2001

(65) Prior Publication Data
US 2001/0015767 A1 Aug. 23, 2001

(30) Foreign Application Priority Data
Feb. 23, 2000 (JP) .............................. 2000-046523

(51) Int. Cl.
H04N 5/225 (2006.01)
(52) U.S. Cl. ...................... 348/373; 348/340
(58) Field of Classification Search ................ 348/373, 348/374, 376, 335, 340, 294, 342
See application file for complete search history.

(56) References Cited

U.S. PATENT DOCUMENTS

| | | | |
|---|---|---|---|
| 4,843,036 A | 6/1989 | Schmidt et al. | |
| 5,302,778 A * | 4/1994 | Maurinus | 257/432 |
| 5,783,815 A | 7/1998 | Ikeda | |
| 6,335,759 B1 * | 1/2002 | Harada | 348/373 |
| 6,417,884 B1 * | 7/2002 | Chang et al. | 348/373 |
| 6,603,107 B1 * | 8/2003 | Miyake | 250/208.1 |
| 6,665,455 B1 * | 12/2003 | Ting | 348/373 |
| 6,693,674 B1 * | 2/2004 | Wataya et al. | 348/373 |
| 6,768,516 B1 * | 7/2004 | Yamada et al. | 348/340 |
| 2001/0050721 A1 * | 12/2001 | Miyake | 348/374 |
| 2002/0163589 A1 * | 11/2002 | Yukawa et al. | 348/374 |
| 2004/0061799 A1 * | 4/2004 | Atarashi et al. | 348/340 |
| 2005/0001923 A1 * | 1/2005 | Chiang et al. | 348/340 |
| 2005/0046735 A1 * | 3/2005 | Tan et al. | 348/340 |
| 2005/0052568 A1 * | 3/2005 | Tan et al. | 348/340 |

FOREIGN PATENT DOCUMENTS

| | | |
|---|---|---|
| EP | 0 773 673 | 5/1997 |
| FR | 2 690 533 | 10/1993 |
| JP | 7-202152 | 8/1995 |
| JP | 7-226524 | 8/1995 |
| JP | 9-130683 | 5/1997 |
| JP | 9-284617 | 10/1997 |
| JP | 10-10394 | 1/1998 |
| JP | 11-14878 | 1/1999 |
| WO | WO 92/15036 | 9/1992 |
| WO | WO 99/13515 | 3/1999 |

OTHER PUBLICATIONS

Patent Abstracts of Japan, JP 56 103481, Aug. 18, 1981.
Patent Abstracts of Japan, JP 04 023469, Jan. 27, 1992.
U.S. Appl. No. 09/789,583, filed Feb. 22, 2001, Pending.
U.S. Appl. No. 09/828,229, filed Apr. 9, 2001, Pending.

* cited by examiner

Primary Examiner—David Ometz
Assistant Examiner—John M. Villecco
(74) Attorney, Agent, or Firm—Oblon, Spivak, McClelland, Maier & Neustadt, P.C.

(57) ABSTRACT

An integration of a pickup element and an optical element including an imaging lens can be integrated with a casing to miniaturize the obtained pickup device. In accordance with the present invention a pickup device includes a substrate, a pickup element provided on the substrate, an optical element provided on the pickup element and having at least one imaging lens, a wire electrically connecting the substrate and the pickup element together, and a resin seal sealing the wire while exposing the imaging lens, the pickup element and the optical element integrated together and a casing being integrated by the resin seal and thus miniaturized.

20 Claims, 7 Drawing Sheets

FIG.1A  FIG.1B
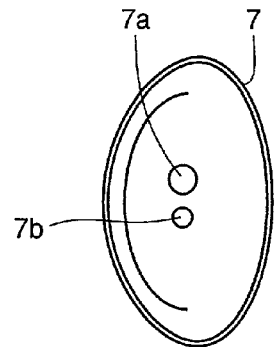
FIG.1C
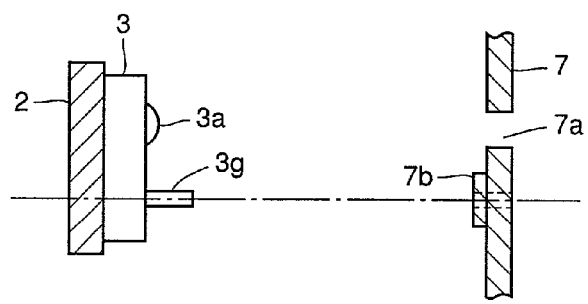
FIG.1D  FIG.1E
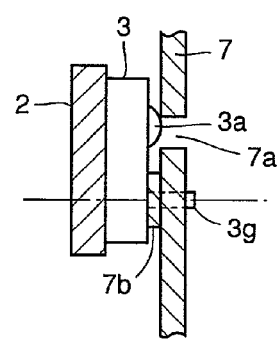
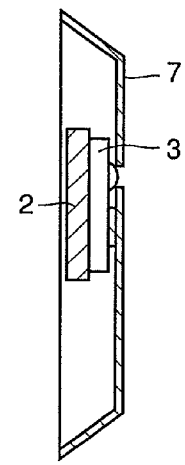

PICKUP DEVICE

BACKGROUND OF THE INVENTION

1. Field of the Invention

The present invention relates to pickup devices with an integration of a pickup element and an optical element having an imaging lens and methods of manufacturing the same.

2. Description of the Background Art

A conventional pickup device of such type is disclosed for example in Japanese Patent Laying-Open No. 9-284617. The document discloses that an optical element formed of an imaging lens and a plurality of legs is arranged on a charge coupled device (CCD) bare chip corresponding to a pickup element mounted on a substrate. The legs abut against upper corners of the bare chip of the CCD to allow the imaging lens and a light receiving surface of the CCD's bare chip to have a predetermined, relative positional relationship therebetween with the lens's focal length taken into account.

Conventionally, pickup devices of this type employ a lens with a fixed focus and to ensure that the imaging lens and the light receiving surface of the pickup element have a precise relative positional relationship therebetween with the lens's focal length taken into account the optical element is required to have a plurality of legs. Thus, conventional pickup devices, having a complicated lens structure and also packaged, are hardly miniaturized.

SUMMARY OF THE INVENTION

The present invention contemplates a pickup device having a simple lens structure and integrally fixing a pickup element and an optical element together to miniaturize the same.

The present invention in one aspect provides a pickup device including: a pickup element; an optical element including an imaging lens imaging light on the pickup element and a coupling portion, and integrated with the pickup element; and a casing including a fixing portion fixing thereto the pickup element and optical element integrated, and an opening, and the coupling portion is fixed to the fixing portion to fix the pickup element and the optical element to the casing with the opening arranged to expose the imaging lens.

As such, there can be provided a pickup device using a simple imaging-lens structure and also integrated and thus miniaturized. Furthermore the pickup device can be fabricated with a precise, relative positional relationship between the imaging lens and the pickup element and that between the opening and the imaging lens. Furthermore, integrating the pickup element, the optical element and the casing together can reduce the number of components for example in attachment. Thus the pickup device can be fabricated through a simple process and highly efficiently. Furthermore, the above configuration does not require an integration of the optical element and the pickup element to be provided on the substrate and a signal interface can be connected. This can save a portion of the substrate otherwise used to fix the integrated elements thereto, to miniaturize the pickup device and also provide an increased degree of freedom in designing the same.

In the pickup device in the above one aspect for example the coupling portion can be a protrusion provided on that side of the optical element which is provided with the imaging lens and the fixing portion can be a receiving portion receiving the protrusion.

As such, a simply structured member can be used for integration and the above-mentioned relative positional relationships can be set precisely.

In the pickup device in the above one aspect for example the protrusion can be stepped to have a wide foot closer to the optical element and a top narrow portion and the fixing portion can be a receiving portion receiving the top portion of the protrusion.

Thus the casing and the optical element can be spaced with precision.

In the pickup device in the above one aspect for example there can be provided more than one protrusion and more than one receiving portion.

This can prevent the casing and the integrated optical element and the like from rotating and thus being offset from each other.

In the pickup device in the above one aspect for example the imaging lens can protrude from a top surface of the protrusion and the receiving portion can be a portion of the casing that surrounds the opening and is reduced in thickness.

As such the casing, the optical element and the like can be readily processed and productivity can thus be enhanced.

In the pickup device in the above one aspect for example the optical element and the casing can be bonded together at a portion including the protrusion and the receiving portion.

As such in the fabrication process the portion to be fit and the opening can have therebetween a relative positional relationship constantly, accurately maintained. Furthermore the positional relationship can also be firmly maintained while the pickup device is being used. Furthermore, external impact can be alleviated as adhesive can serve as a buffer.

In the pickup device in the above one aspect for example the opening can be provided with a member removing infrared light.

Thus, infrared light can be removed.

In the pickup device in the above one aspect for example the imaging lens can be exposed through the casing at the opening provided with a light blocking portion tapering toward the imaging lens to reduce the casing in thickness for shielding a periphery of the imaging lens from light.

The tapering, light blocking member can provide the casing with a function of a diaphragm. This can eliminate the necessity of providing the exact pickup device with a function of a diaphragm. As such, the pickup device can be fabricated through a simplified process and thus improved in quality.

The present invention in another aspect provides a pickup device including: a substrate; a pickup element arranged on the substrate; an optical element arranged on the pickup element and having at least one imaging lens; a wire electrically connecting a connection of the substrate and a connection of the pickup element together; and a resin seal sealing the optical element and the pickup element as well as the wire while exposing the imaging lens provided to the optical element.

Thus the resin seal can protect the pickup device against external force, moisture and the like and integrate the optical element and the pickup element into a small size.

In the pickup device in another aspect for example the optical element can be provided with the imaging lens on a curving side thereof.

If the optical element has a pointed edge, at the edge the resin seal would flow down and in a vicinity of the edge the resin seal would be reduced in thickness, disadvantageously resulting in the thin resin transmitting light to the pickup element. The optical element having a curving geometry can prevent the resin seal from having a portion reduced in thickness.

In the pickup device in another aspect for example the optical element including the imaging lens can be formed of a transparent material.

As such the imaging lens can be provided on the optical element to further simplify the structure of the pickup device.

In the pickup device in another aspect for example the optical element can have a surface tapering from a foot of the imaging lens toward an edge of the optical element.

This can prevent the resin seal from reducing in thickness on an edge of an end of the optical element.

In the pickup device in another aspect for example the surface tapering can be unleveled to increase a resistance against a flow of a sealing resin.

This can prevent the resin seal from flowing down and thus locally reducing in thickness.

In the pickup device in another aspect for example the sealing resin can include a first sealing resin and a second sealing resin, the first sealing resin being a resin sealing the wire and covering a side periphery of the pickup element, a side periphery of the optical element and the substrate, the second sealing resin being a resin exhibiting a level of thixotropy lower than the first sealing resin and covering a surface of the optical element excluding the imaging lens.

Increasing the thixotropy of the resin seal covering the side peripheries of the pickup and optical elements, can prevent the resin seal from flowing. As such, the pickup element and the like can be effectively fixed.

In the pickup device in another aspect for example the optical element can have a surface provided with a recess surrounding the imaging lens and filled with the sealing resin.

The recess can receive the resin to prevent the resin seal for example from varying in thickness and adhering to the imaging lens.

The pickup device in another aspect for example the recess can receive a light blocking member and the sealing resin can cover the optical element while the sealing resin can be in contact with an outer periphery of the light blocking member.

As such a function of a diaphragm can be provided by a simple structure.

In the pickup device in another aspect for example a member removing infrared light is arranged, supported by the light blocking member, to shield the imaging lens from light.

As such, infrared light can be removed and the resin seal can also be reliably prevented from adhering to the imaging lens.

In the pickup device in another aspect for example the light blocking member can be tapered toward an inner periphery thereof.

As such, the function of the diaphragm can further be enhanced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a plan view of a geometry of a first embodiment of the present invention, FIG. 1B is a side view of a geometry of a casing thereof, FIG. 1C is a cross section of an integration of a pickup element and an optical element and a casing in the first embodiment before the integration and the casing are fabricated together, FIG. 1D is a partial cross section after the integration of the pickup element and the optical element, and the casing are fabricated together, and FIG. 1E is a cross section of a general configuration thereof;

DESCRIPTION OF THE PREFERRED EMBODIMENTS

First Embodiment

Figure 2A:
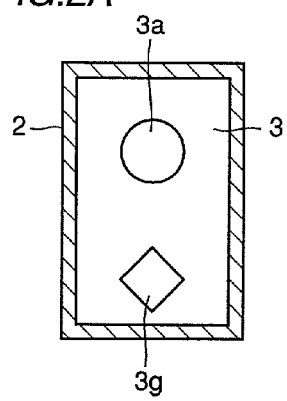
FIGS. 2A and 2B are a front view and a side view, respectively, of a second embodiment of the present invention.

A first embodiment of the present invention will now be described with reference to FIGS. 1A–1E. FIG. 1A is a plan view of a geometry of a casing for a pickup device of the first embodiment. FIG. 1B is a plan view of a geometry of the casing. FIG. 1C is a cross section of an integration of a pickup element and an optical element to be integrated with the casing in the first embodiment and the casing before the integration and the casing are fabricated together. FIG. 1D is a partial cross section after the integration of the pickup element and the optical element, and the casing are fabricated together. FIG. 1E is a cross section of a general configuration thereof. In FIGS. 1A–1E, a reference character 2 denotes a pickup element having a light receiving portion and a reference character 3 denotes an optical element having at least one imaging lens 3a and a protrusion 3g spaced from imaging lens 3a, and integrated with pickup element 2. Reference character 7 denotes a casing housing a pickup device corresponding to pickup element 2 and optical element 3 combined and thus integrated together. Casing 7 has an opening 7a and a recess 7b structured to correspond to protrusion 3g of optical element 3 and positioned opposite thereto. As shown in FIGS. 1C and 1D, protrusion 3g of optical element 3 is fit into recess 7b of casing 7 to integrate the integration of pickup element 2 and optical element 3 and casing 7 together, with imaging lens 3a exposed, entering opening 7a of casing 7. Protrusion 3g of optical element 3 and recess 7b of casing 7 correspond in geometry to each other to allow the former to be fit into the latter for fabrication. Casing 7 has a geometry, as shown in FIGS. 1B and 1E, in the form of a frustum of a circular cone with its smaller round surface opposite to optical element 3 and its larger, round, open plane substantially in the same plane as or outer than a surface of pickup element 2 that does not face the optical element.

Second and Third Embodiments

Figure 2B:
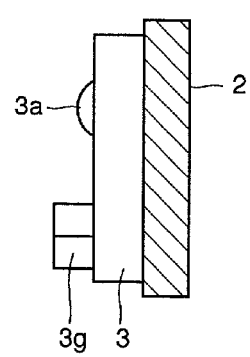
Figure 3A:
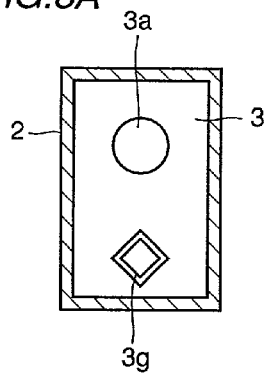
FIGS. 3A and 3B are a front view and a side view, respectively, of a third embodiment of the present invention.
Figure 3B:
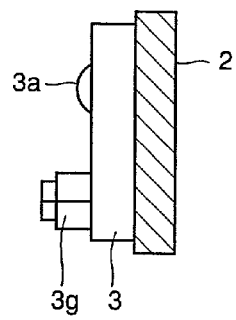

FIGS. 2A and 2B are a front view and a side view, respectively, of a second embodiment of the present invention. FIGS. 3A and 3B are a front view and a side view, respectively, of a third embodiment of the present invention. In FIGS. 2A and 2B optical element 3 is provided thereon with protrusion 3g quadrangular in cross section. In FIGS. 3A and 3B optical element 3 is provided thereon with protrusion 3g in two parallelepipedons, one stacked on the other. As shown in the figures, the top parallelepipedon has a side smaller than the bottom parallelepipedon to allow opening 7a of casing 7 (not shown) to be level with the upper surface of the bottom parallelepipedon. Accordingly, the parallelepipedon is level with or slightly higher than the protrusion of imaging lens 3a. Although not shown in FIGS. 2A–3B, it is needless to say that casing 7 has recess 7a formed in a parallelepipedon to correspond to protrusion 3g.

Fourth Embodiment

Figure 4A:
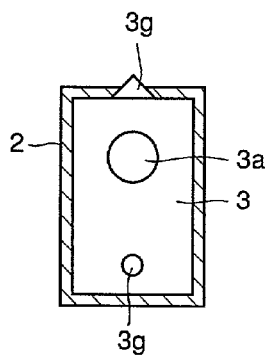
FIGS. 4A and 4B are a front view and a side view, respectively, of the pickup device of the fourth embodiment.
Figure 4B:
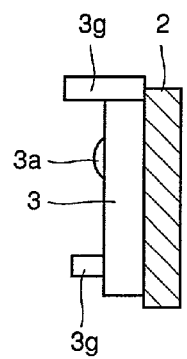
Figure 4C:
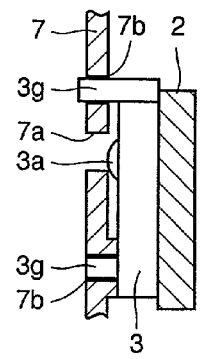
FIG. 4C is a side view of a structure provided when the pickup device of the fourth embodiment is attached to the casing.

A fourth embodiment of the present invention will be described with reference to FIGS. 4A–4C. FIGS. 4A and 4B are a front view and a side view, respectively, of the pickup device of the first embodiment. FIG. 4C is a side view of a structure provided when the pickup device of the first embodiment is attached to a casing. In FIGS. 4A–4C like reference characters denote like components shown for example in FIG. 1. In FIGS. 4A–4C, optical element 3 is provided thereon with a plurality of protrusions 3g.

Thus in the first, third and fourth embodiments a pickup device corresponding to an integration of pickup element 2 and optical element 3 can be prevented from rotating relative to casing 7. Protrusion 3g of optical element 3 may be bonded to recess 7b of casing 7 to integrate the pickup device and the casing together. It should be noted that while in these embodiments optical element 3 has protrusion 3g and casing 7 has recess 7b the present invention is not limited thereto and the protrusion 3g cross section is also not limited to be round or quadrangular.

Thus in the first to fourth embodiments a pickup device includes a component to be housed in casing 7 that is integrated with optical element 2. Thus it can be reduced in the number of components and thus readily attached to casing 7. In general a pickup device has a pickup element and optical element fixed on a substrate and strictly speaking it is arranged independently of its casing, whereas in the first embodiment a pickup device may not have an integration of a pickup element and an optical element that is fixed on a substrate and a signal interface suffices for the operation of the pickup device, communications for signal processing, and the like. Thus the area of the substrate otherwise consumed by a pickup element fixed thereon can be saved to miniaturize the pickup device and increase the degree of freedom in designing the same.

Fifth Embodiment

Figure 5A:
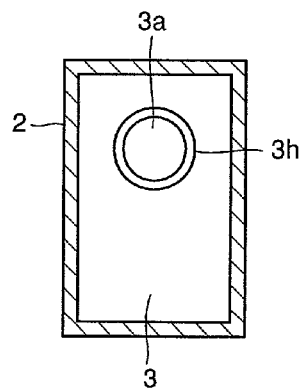
FIGS. 5A and 5B are a front view and a side view, respectively, of a pickup device in a fifth embodiment of the present invention.
Figure 5B:
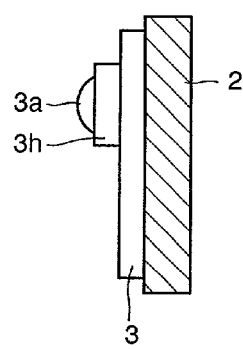
Figure 5C:
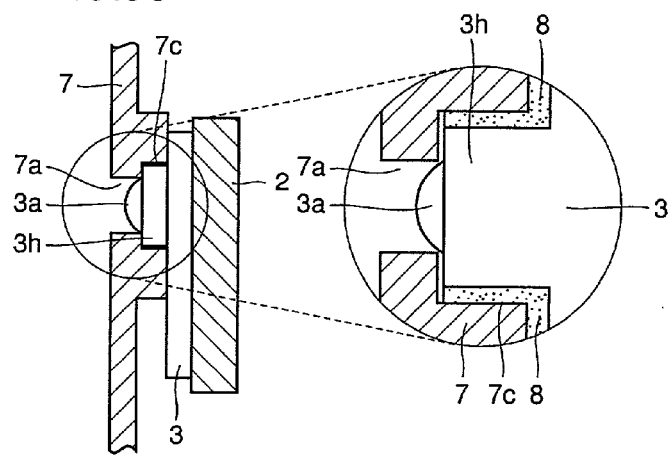
FIG. 5C is a side view and a partially enlarged view showing a structure provided when the pickup device of the fifth embodiment is attached to a casing.

A fifth embodiment of the present invention will be described with reference to FIGS. 5A–5C. FIGS. 5A and 5B are a front view and a side view, respectively, of a pickup device of the fifth embodiment. FIG. 5C is a side view and a partially enlarged view of a structure provided when the pickup device of the fifth embodiment is attached to its casing. In FIGS. 5A–5C like reference characters denote like components shown in FIG. 1. As shown in FIGS. 5A and 5B, optical element 3 has a protrusion 3h and imaging lens 3a is provided on protrusion 3h. Protrusion 3h, as shown in FIG. 5C, is fit into casing 7 at a receiving portion 7c formed at a peripheral portion of opening 7a closer to the optical element. That portion of casing 7 protruding toward the optical element to provide receiving portion 7c, is adapted to protrude having substantially the same height as or slightly lower than protrusion 3h.

In FIG. 5C a reference character 8 denotes an adhesive applied for example between the portion of casing 7 protruding toward the optical element and protrusion 3h of the optical element to integrate optical element 3 and casing 7 together. Furthermore, as shown in FIG. 5C, imaging lens 3a is exposed via opening 7a. As such, when an integration of pickup element 2 and optical element 3 is housed in casing 7 the integration has its position determined relative to casing 7 and the pickup device can be readily fabricated. Furthermore, providing optical element 3 with protrusion 3h allows optical element 3 to have a step in geometry and hence a relative position determined in the direction of the height. It is important that in a pickup device product, imaging lens 3a on optical element 3 and opening 7a of casing 7 have an appropriate, relative, positional relationship therebetween as the pickup device takes a subject in as optical information. In the fifth embodiment the lens and the opening can be readily aligned.

Sixth Embodiment

Figure 6A:
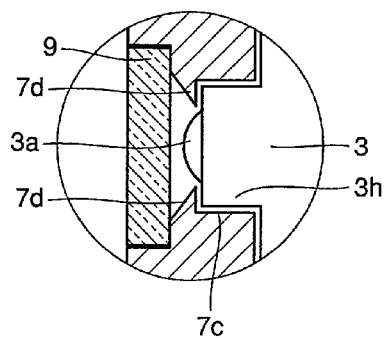
FIGS. 6A and 6B are partially enlarged cross sections of a pickup device in a sixth embodiment of the present invention.
Figure 6B:
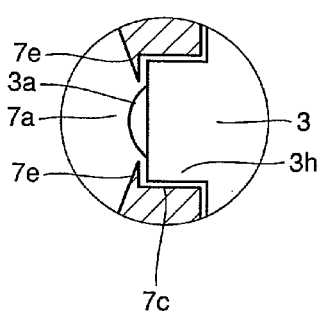

A sixth embodiment of the present invention will be described with reference to FIGS. 6A and 6B. FIGS. 6A and 6B are partially enlarged cross sections of a pickup device of the sixth embodiment. In FIGS. 6A and 6B like reference characters denote like components shown in FIGS. 5A–5C. The FIG. 6 pickup device is basically similar to the FIG. 5C pickup device. The former is characterized in that imaging lens 3a is surrounded by a portion of casing 7 notched 7d to receive an infrared removal member 9 functioning to remove infrared light. Opening 7a has a periphery tapering 7e to effectively serve as a diaphragm for incident light. In the present embodiment, optical element 3 has imaging lens 3a provided on protrusion 3h having a periphery fit into casing 7 at receiving portion 7c and fixed thereto with adhesive 8 to integrate the integration of optical element 3 and pickup element 2 with casing 7 and thus fix the integration to the casing.

Thus in the pickup device of the sixth embodiment adhesive 8 can be used to integrate optical element 3 with casing 7. As such, if an external force is exerted through opening 7a to push optical element 3 inward the external force can be absorbed by the adhesiveness of adhesive 8 provided between optical element 3 and casing 7 to alleviate the impact exerted directly onto pickup element 2 that is attributed to the external force. Furthermore, as shown in FIG. 6B, casing 7 can have opening 7a having a periphery tapered 7e to serve as a diaphragm for incident light. Since the pickup device can be integrated with a casing also having a function of a diaphragm, the pickup device is not required to also have a function of a diaphragm. Thus, the pickup device can be fabricated in a reduced number of process steps and the process can also be improved in quality to reduce the cost for fabricating the device.

Furthermore the plate provided at the casing's opening 7a and effectively removing infrared light can eliminate the necessity of providing the exact pickup device with an infrared removal means. As such, the pickup device can be fabricated in a reduced number of process steps and the process can also be improved in quality to reduce the cost for fabricating the device. More specifically, in the process for fabricating an optical element integrated pickup device, having a factor significantly varying in quality, the number of components required and hence the number of process steps can be reduced and so can a possibility that a defect will be caused, to provide the process with stable and improved quality. It should be noted that component 9 functioning to remove infrared light may be formed of hard material. Thus, if an external force is exerted through the casing's opening 7a to push optical element 3 inwards the load on the pickup device can be alleviated and imaging lens 3a can be free from scratches or the like otherwise attributed to the external force.

Seventh Embodiment

Figure 7:
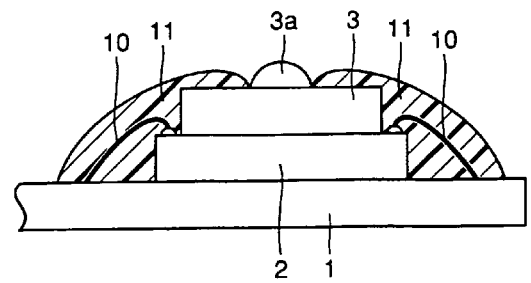
FIG. 7 shows a structure of a pickup device in a seventh embodiment of the present invention.

A seventh embodiment of the present invention will be described with reference to FIG. 7. FIG. 7 shows a structure of a pickup device of the seventh embodiment. In FIG. 7, a reference character 1 denotes a substrate, a reference character 2 denotes a pickup element, a reference character 3 denotes an optical element having at least one imaging lens 3a, a reference character 10 denotes a gold wire electrically connecting substrate 1 and pickup element 2 together through wire-bonding, and a reference character 11 denotes a resin seal sealing gold wire 10. Pickup element 2 is packaged on substrate 1 and electrically connected by gold wire 10 through wire-bonding. Optical element 3, temporarily fixed on pickup element 2 with an adhesive, is integrated on and thus fixed to the substrate with resin seal 11.

Configured as above, resin seal 11 can absorb moisture and prevent any foreign matters from entering the pickup device to protect the device and the resin seal can also protect the device against external force while integrating optical element 3 and pickup element 2 together and miniaturizing the device. Note that resin seal 11 may be formed of light blocking resin to achieve the aforementioned effect as well as preventing a ray of light from being introduced into a light receiving surface of pickup element 2 through any other portion than imaging lens 3a. The pickup device can also dispense with any component having a packaging function and it can thus be fabricated with a reduced number of components and also miniaturized. Furthermore in the seventh embodiment the resin seal is not limited in material and it may for example be a silicon-based, elastic resin and it may also for example be an epoxy-based, hard resin. The manner of providing the resin seal is also not limited and it may for example be dispensed or molded. Furthermore, pickup element 2 and substrate 1 may also be electrically connected together via a component other than gold wire 10.

Furthermore in FIG. 7 resin seal 11 has a curving geometry over optical element 3 excluding imaging lens 3a. For example, if a liquid, light blocking resin seal is employed with optical element 3 having a surface with a pointed edge, at the pointed edge resin seal 11 would disadvantageously flow down and consequently at the edge resin seal 11 would be reduced in thickness. Thus, the edge of optical element 3 disadvantageously passes light received through resin seal 11 reduced in thickness and thus transmits the light to pickup element 2. In contrast, if resin seal 11 has a geometry with a surface smoothly curving over optical element 3 excluding imaging lens 3a, as shown in FIG. 7, it would not have the pointed edge described as above. As such, resin seal 11 can be prevented from having a portion reduced in thickness and it can thus maintain a light blocking function as desired.

Eighth Embodiment

Figure 8:
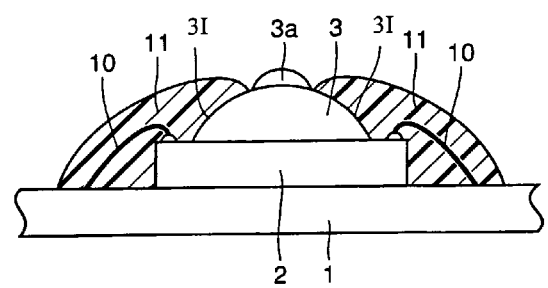
FIG. 8 shows a structure of a pickup device in an eighth embodiment of the present invention.
Figure 9A:
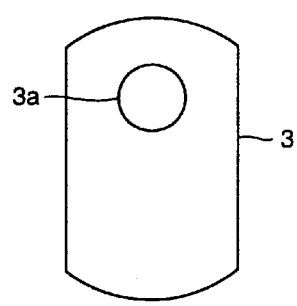
FIGS. 9A, 9B and 9C are a plan view, a front view and a side view, respectively, of a geometry of an optical element of the FIG. 8 pickup device.
Figure 9C:
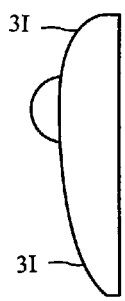
Figure 9B:
Figure 10:
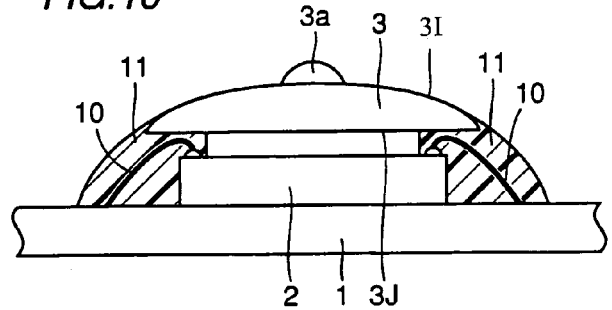
FIG. 10 shows a structure of the pickup device of the eighth embodiment.
Figure 11A:
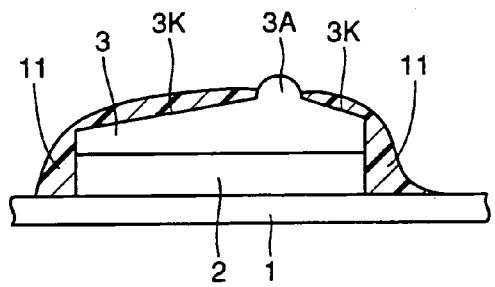
FIGS. 11A and 11B are a plan view and a side view, respectively, of the pickup device of the eighth embodiment.
Figures 11B, 11C:
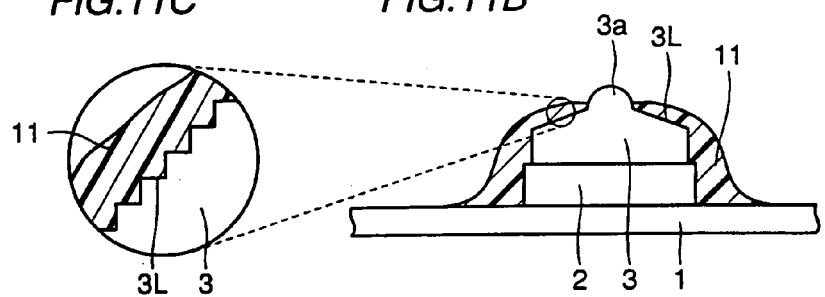
FIG. 11C is an enlarged view of a portion of a surface of the FIG. 11B pickup device.

An eighth embodiment of the present invention will be described with reference to FIGS. 8, 9A–9C, 10, and 11A and 11B. FIG. 8 shows a structure of a pickup device of the eighth embodiment. FIGS. 9A, 9B and 9C are a plan view, a front view and a side view, respectively, of an optical element of the present embodiment. FIG. 10 shows another structure of the pickup device of the eighth embodiment. FIGS. 11A and 11B are a plan view and a side view with a partially enlarged view added thereto, respectively, of the pickup device of the eighth embodiment. In FIGS. 8, 9A–9C, 10, and 11A and 11B, like reference characters denote like components shown in FIG. 7. In FIGS. 8 and 10 the pickup device is characterized in that optical element 3 excluding imaging lens 3a has a geometry with a smoothly curving surface 3I. Furthermore in FIG. 10 optical element 3 is provided in the form of an umbrella 3J to cover a wire bonding portion. Furthermore in FIGS. 11A and 11B optical element 3 excluding imaging lens 3a has a geometry with a surface tapered 3K.

In FIG. 8, optical element 3 excluding imaging lens 3a has a geometry with a surface curving to be round to remove a pointed edge, as shown in FIGS. 9A–9C. Wire bonding is used to electrically connect pickup element 2 to substrate 1 and on pickup element 2 optical element 3 is temporarily fixed and resin seal 11 is employed to seal the electrically coupling portion while integrating optical element 3 with substrate 1 and pickup element 2 and thus fix the optical element to the substrate and the pickup element to configure a pickup device. The pickup device of the eighth embodiment is as disadvantageous as that of the seventh embodiment if a liquid, light blocking resin seal is employed. More specifically, if optical element 3 has a surface with a pointed edge then at the edge resin seal 11 would flow down and consequently in a vicinity of the edge resin seal 11 would be disadvantageously reduced in thickness. Thus the edge of optical element 3 would disadvantageously pass light introduced through resin seal 11 reduced in thickness and thus transmit the light to pickup element 2. In contrast, optical element 3 excluding imaging lens 3a that has a geometry with a surface smoothly curved, as shown in FIGS. 9A–9C, can be free of the aforementioned pointed edge to prevent the resin seal from having a portion reduced in thickness and also maintain the resin seal's light blocking function, as appropriate.

Furthermore, with reference to FIG. 11A, if in a vicinity of an upper corner of pickup element 2 optical element 3 tapers 3K at a foot thereof with an edge having a large angle, light blocking resin seal 11 on the edge can be prevented from having a significantly reduced thickness and it can thus maintain a light blocking function as desired. As shown in the FIGS. 11B and 11C partially enlarged view, optical element 3 excluding imaging lens 3a can have a geometry with a surface provided with fine protrusions and recesses 3L to increase a resistance against the flow of resin seal 11 on the surface of optical element 3 to prevent resin seal 11 from flowing and thus varying in shade, to achieve an enhanced light blocking function.

While in FIG. 11B optical element 3 has protrusions and recesses 3L in the form of steps, it is not limited thereto and may for example be frosted, provided in the form of frosted glass, or any other means increase a resistance against the flow of a fluid at an interface between resin seal 11 and optical element 3. Furthermore in providing the resin seal a liquid, silicon-based resin that has elasticity after it has cured may be used and gold wire 10 may be covered with a form of umbrella 3J. Thus, while an elastic resin seal is used, optical element 3 in the form of an umbrella 3J can further protect gold wire 10 from external force to provide an enhanced level of strength against external force. Note that if a hard resin seal is used, a form of umbrella 3L can also enhance the reliability of the product.

Ninth Embodiment

Figure 12:
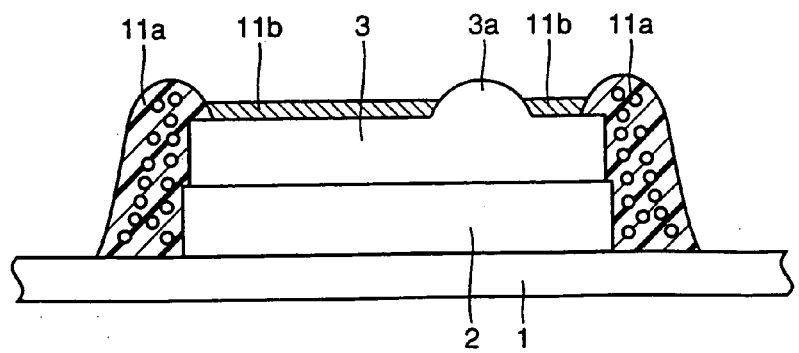
FIG. 12 shows a structure of a pickup device in a ninth embodiment of the present invention.

A ninth embodiment of the present invention will be described with reference to FIG. 12. FIG. 12 shows a structure of a pickup device of the ninth embodiment. In FIG. 12 like reference characters denote like components shown in FIG. 11 and such components will thus not be described. In FIG. 12, resin seal 11 is formed of a resin seal 11a high in thixotropy and a resin seal 11b low in viscosity. Optical element 3 and pickup element 2 are integrated with substrate 1 by resin seal 11 formed of resin seal 11a high in thixotropy and viscosity covering a portion extending from an upper corner of optical element 3 to substrate 1 and resin seal 11b lower than resin seal 11a in thixotropy and viscosity covering an upper surface of optical element 3. As such, resin seal 11a, high in thixotropy and viscosity, can maintain the exact geometry of the resin seal, preventing the resin seal from flowing, to maintain a light blocking function, as desired. Note that resin seal 11b may also exhibit a high level of thixotropy.

Tenth Embodiment

Figure 13A:
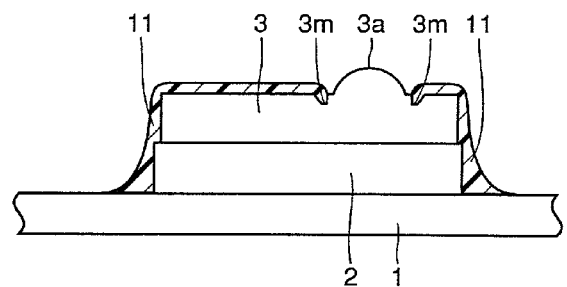
FIGS. 13A and 13B are a front view and a side view, respectively, of a pickup device in a tenth embodiment of the present invention.
Figure 13B:
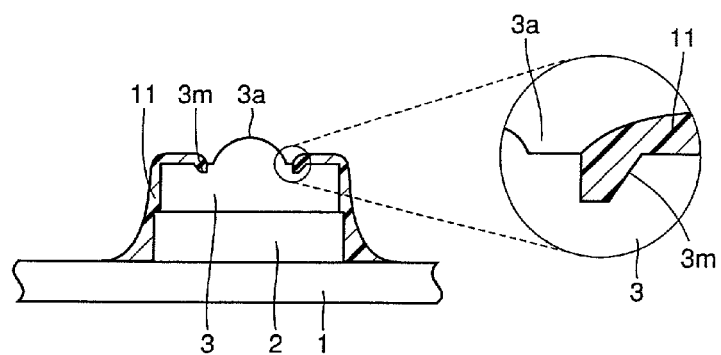
Figure 13C:
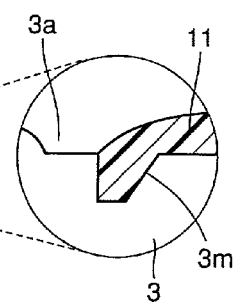
FIG. 13C is a partially enlarged view of the FIG. 13B device.
Figure 14A:
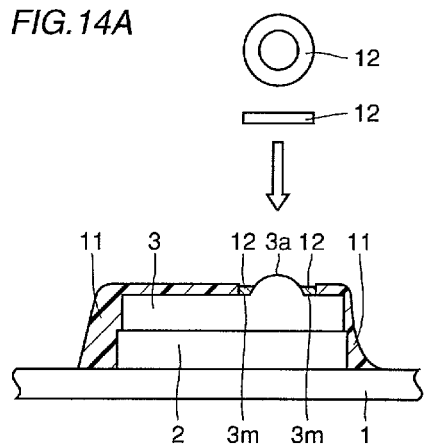
FIGS. 14A and 14B are a front view and a side view, respectively, of the pickup device of the tenth embodiment.
Figures 14B, 14C:
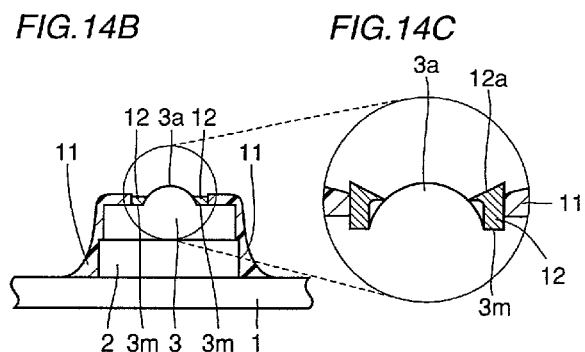
FIG. 14C is a partially enlarged view of the FIG. 14B device.
Figure 15:
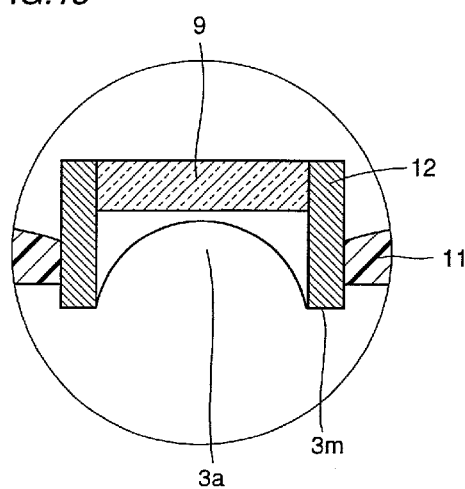
FIG. 15 is an enlarged view of a portion showing another embodiment with respect to a portion corresponding to FIG. 14B.

A tenth embodiment provides a pickup device, as described with reference to FIGS. 13A–13C, 14A–14C and 15. FIGS. 13A and 13B and FIGS. 14A and 14B are front and side views of the pickup device of the present embodiment. FIG. 15 is a partially enlarged view showing another embodiment for a portion corresponding to FIG. 14C. In FIGS. 13 and 14A and 14B, like reference characters denote like components shown in FIG. 12 and they will thus not be described. In FIGS. 13 and 14, imaging lens 3a has a most peripheral portion in geometry provided with a recess 3m. In FIGS. 14A and 14B, recess 3m receives a light blocking component 12 shaped as labeled 12a to function as a diaphragm for light incident thereon, as shown in the partially enlarged view provided in FIG. 14B. In FIG. 15, imaging lens 3a is surrounded by light blocking component 12 with infrared removal component 9 fit thereinto.

Thus, as shown in FIGS. 13A–13C, the optical element's imaging lens 3a has a most peripheral portion provided with recess 3m and resin seal 11 is provided to integrate and fix optical element 3, pickup element 2 and substrate 1 together. With reference to FIGS. 13A–13C, a portion receiving sealing resin 11 is provided in optical element 3 at recess 3m to prevent a variation in the amount of the resin applied on optical element 3 from resulting in the resin having a geometry disadvantageously distorting in a vicinity of imaging lens 3a relative to a peripheral geometry of the lens and prevent the resin from disadvantageously adhering to a surface of the lens. Thus, resin seal 11 applied can have a geometry accurately sealing a periphery of imaging lens 3a and also be prevented from adhering to a surface of the lens.

Furthermore, with reference to FIGS. 14A–14C, light blocking component 12 dimensioned to correspond to recess 3m shown in FIGS. 13A–13C and thus receivable by the recess for fabrication is fit thereinto for fabrication while abutting against optical element 3. Thus, resin seal 11 can be applied in a geometry without having any effect on a periphery of imaging lens 3a, imaging lens 3a can have a most peripheral portion reliably shielded against light by light blocking component 12, resin seal 11 can be reliably prevented from adhering to a surface of imaging lens 3a, and resin seal 11 can be applied readily and with constant quality. Furthermore, as shown in the partially enlarged view provided in FIG. 14C, light blocking component 12 can have a portion close to a periphery of imaging lens 3a, as labeled 12a, to function as a diaphragm for light incident thereon.

Note that while in the tenth embodiment light blocking component 12a having a function of a diaphragm and component 9 having an infrared removal effect are provided separately, they may be provided together. If they are provided together, resin seal 11 can integrate and fix optical element 3, pickup element 2 and substrate 1 together in the production of the pickup device without impairing imaging lens 3a at a periphery thereof in optical performance and the effects achieved in the seventh embodiment can also be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pickup device comprising:
   a pickup element;
   an optical element including an imaging lens imaging light on said pickup element and a coupling portion, said optical element integrated with said pickup element; and
   a casing including a fixing portion fixing thereto said pickup element and optical element, and an opening, said coupling portion being fixed to said fixing portion to fix said pickup element and said optical element to said casing with said opening arranged to expose said imaging lens, said fixing portion including a contiguous receiving portion, said contiguous receiving portion having a thickness less than a thickness of a surrounding portion of said casing, said contiguous receiving portion configured to receive said coupling portion, said contiguous receiving portion including said opening therein.

2. The pickup device according to claim 1, wherein said coupling portion is a protrusion, said optical element provided with said imaging lens on a side of said protrusion, and said receiving portion receives said protrusion.

3. The pickup device according to claim 2, wherein said protrusion is stepped to have a wide foot closer to said optical element and a top narrow portion and said fixing portion corresponds to a receiving portion receiving said top portion of said protrusion.

4. The pickup device according to claim 2, wherein said imaging lens protrudes from a top surface of said protrusion.

5. The pickup device according to claim 4, wherein said optical element and said casing are bonded together at a portion including said protrusion and said receiving portion.

6. The pickup device according to claim 4, wherein said opening is provided with a member removing infrared light.

7. The pickup device according to claim 1, wherein said imaging lens is exposed through said casing at said opening provided with a light blocking portion shielding a periphery of said imaging lens from light, said light blocking portion tapering toward said imaging lens to reduce said casing in thickness.

8. A pickup device comprising:
a pickup element;
an optical element including an imaging lens imaging light on said pickup element and a coupling portion, said optical element integrated with said pickup element; and
a casing including a fixing portion fixing thereto said pickup element and optical element, and an opening, said coupling portion being fixed to said fixing portion to fix said pickup element and said optical element to said casing with said opening arranged to expose said imaging lens, said coupling portion is a protrusion received by said fixing portion, said protrusion including said optical element.

9. The pickup device according to claim 8, wherein said fixing portion includes a receiving portion configured to receive said protrusion.

10. The pickup device according to claim 9, wherein said imaging lens protrudes from a top surface of said protrusion and said receiving portion corresponds to a portion of said casing surrounding said opening and reduced in thickness.

11. The pickup device according to claim 10, wherein said optical element and said casing are bonded together at a portion including said protrusion and said receiving portion.

12. The pickup device according to claim 10, wherein said opening is provided with a member removing infrared light.

13. The pickup device according to claim 8, wherein said imaging lens is exposed through said casing at said opening provided with a light blocking portion shielding a periphery of said imaging lens from light, said light blocking portion tapering toward said imaging lens to reduce said casing in thickness.

14. A pickup device comprising:
a pickup element;
an optical element including an imaging lens imaging light on said pickup element and a coupling portion, said optical element integrated with said pickup element; and
a casing including a fixing portion fixing thereto said pickup element and optical element, and an opening, said coupling portion being fixed to said fixing portion to fix said pickup element and said optical element to said casing with said opening arranged to expose said imaging lens, said fixing portion including a receiving portion reduced in thickness, said receiving portion configured to receive said coupling portion, said receiving portion reduced in thickness including said opening therein,
wherein said coupling portion is a protrusion, said optical element is provided with said imaging lens on a side of said protrusion, and said receiving portion receives said protrusion.

15. The pickup device according to claim 14, wherein said protrusion is stepped to have a wide foot closer to said optical element and a top narrow portion and said fixing portion corresponds to a receiving portion receiving said top portion of said protrusion.

16. The pickup device according to claim 14, there are provided more than one said protrusion and more than one said receiving portion.

17. The pickup device according to claim 14, wherein said imaging lens protrudes from a top surface of said protrusion.

18. The pickup device according to claim 17, wherein said optical element and said casing are bonded together at a portion including said protrusion and said receiving portion.

19. The pickup device according to claim 17, wherein said opening is provided with a member removing infrared light.

20. The pickup device according to claim 14, wherein said imaging lens is exposed through said casing at said opening provided with a light blocking portion shielding a periphery of said imaging lens from light, said light blocking portion tapering toward said imaging lens to reduce said casing in thickness.

* * * * *